(12) United States Patent
Yang et al.

(10) Patent No.: US 11,508,602 B2
(45) Date of Patent: Nov. 22, 2022

(54) CLEANING TOOL

(71) Applicant: TAIWAN SEMICONDUCTOR MANUFACTURING CO., LTD., Hsinchu (TW)

(72) Inventors: Yueh-Lin Yang, Tainan (TW); Chi-Hung Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/365,878

(22) Filed: Jul. 1, 2021

(65) Prior Publication Data

US 2021/0327743 A1 Oct. 21, 2021

Related U.S. Application Data

(62) Division of application No. 16/358,561, filed on Mar. 19, 2019, now Pat. No. 11,056,371.

(60) Provisional application No. 62/718,947, filed on Aug. 14, 2018.

(51) Int. Cl.
| | | |
|---|---|---|
| *B08B 3/08* | (2006.01) | |
| *H01L 21/683* | (2006.01) | |
| *B08B 7/00* | (2006.01) | |
| *H01L 21/67* | (2006.01) | |
| *C23C 14/50* | (2006.01) | |
| *B08B 3/04* | (2006.01) | |

(52) U.S. Cl.
CPC .......... *H01L 21/6833* (2013.01); *B08B 3/04* (2013.01); *B08B 7/00* (2013.01); *C23C 14/505* (2013.01); *H01L 21/67011* (2013.01)

(58) Field of Classification Search
CPC .......... H01J 37/32862; H01J 37/32449; H01J 37/32834; H01J 2237/334; H01L 21/67069
See application file for complete search history.

(56) References Cited

U.S. PATENT DOCUMENTS

| | | |
|---|---|---|
| 5,993,547 A | 11/1999 | Sato |
| 6,817,057 B2 | 11/2004 | Shirley et al. |
| 10,786,837 B2 | 9/2020 | Saito et al. |
| 2003/0046786 A1* | 3/2003 | Shirley ............. H01L 21/67028 15/301 |
| 2005/0000540 A1 | 1/2005 | Uziel |

(Continued)

FOREIGN PATENT DOCUMENTS

| | | |
|---|---|---|
| CN | 101150047 A | 3/2008 |
| CN | 101587294 A | 11/2009 |

(Continued)

OTHER PUBLICATIONS

Tang, et al., "Study on Wafer Backside Particles in Semiconductor Etching Process", Science & Technology Information, Issue 24, Aug. 23, 2017, pp. 98-101.

*Primary Examiner* — Erin F Bergner
(74) *Attorney, Agent, or Firm* — Maschoff Brennan

(57) ABSTRACT

A method includes transmitting a radiation toward an electrostatic chuck, receiving a reflection of the radiation, analyzing the reflection of the radiation, determining whether a particle is present on the electrostatic chuck based on the analyzing the reflection of the radiation, and moving a cleaning tool to a location of the particle on the electrostatic chuck when the determination determines that the particle is present.

20 Claims, 12 Drawing Sheets

(56) References Cited

U.S. PATENT DOCUMENTS

| | | |
|---|---|---|
| 2005/0031187 A1* | 2/2005 | Lin .................. H01L 21/67253 |
| | | 382/145 |
| 2005/0183754 A1 | 8/2005 | Kago |
| 2006/0218680 A1* | 9/2006 | Bailey, III ................ B25J 5/00 |
| | | 414/217 |
| 2009/0288684 A1 | 11/2009 | Kitaoka et al. |
| 2009/0291372 A1 | 11/2009 | Kubota |
| 2013/0152965 A1 | 6/2013 | Okada et al. |
| 2015/0261104 A1 | 9/2015 | Kamo et al. |
| 2016/0225610 A1* | 8/2016 | Chien ................ G03F 7/70916 |
| 2016/0296982 A1* | 10/2016 | Hirakawa ......... H01L 21/67028 |
| 2017/0125211 A1 | 5/2017 | Ni et al. |
| 2017/0205541 A1* | 7/2017 | Amin ...................... G02B 1/18 |

FOREIGN PATENT DOCUMENTS

| | | |
|---|---|---|
| CN | 202698196 U | 1/2013 |
| CN | 103157625 A | 6/2013 |
| CN | 104968563 A | 10/2015 |
| CN | 107030064 A | 8/2017 |
| CN | 108292598 A | 7/2018 |
| JP | H10-199778 A | 7/1998 |
| JP | 2005-079220 A | 3/2005 |
| KR | 20090055146 A | 6/2009 |
| TW | 201705241 A | 2/2017 |

\* cited by examiner

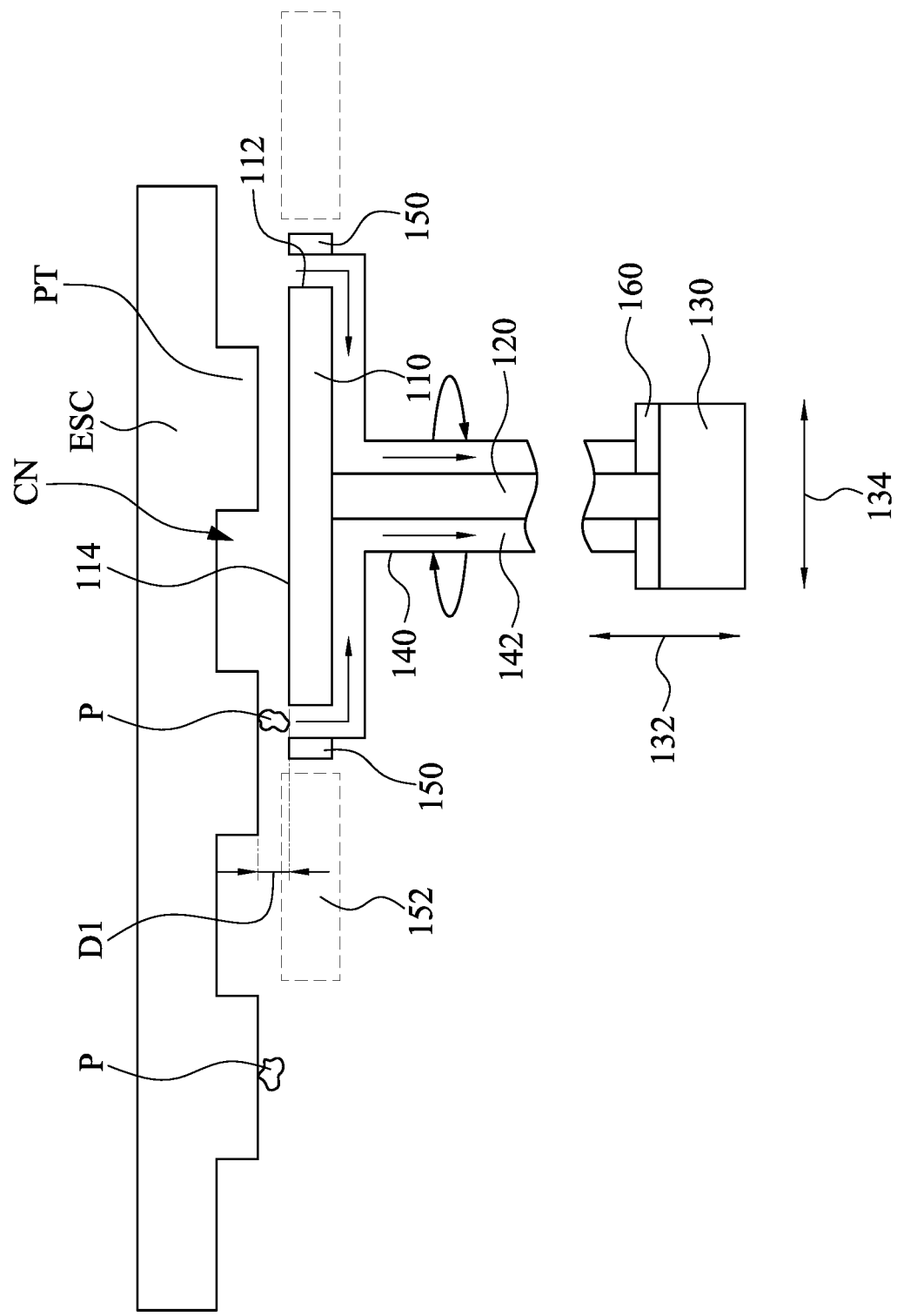

CLEANING TOOL

PRIORITY CLAIM AND CROSS-REFERENCE

This present application is a divisional application of U.S. patent application Ser. No. 16/358,561, filed on Mar. 19, 2019, now U.S. Pat. No. 11,056,371, issued on Jul. 6, 2021, which claims priority to U.S. provisional application Ser. No. 62/718,947, filed on Aug. 14, 2018, all of which are herein incorporated by reference in their entirety.

BACKGROUND

The semiconductor integrated circuit (IC) industry has experienced exponential growth. Technological advances in IC materials and designs have produced generations of ICs in which each generation has smaller and more complex circuits than the previous generation. However, the minimum feature size that may be patterned by the semiconductor lithography processes is substantially limited by the wavelength of the projected radiation source. In order to improve the feature size to be even smaller than before, an extreme ultraviolet (EUV) radiation source and related semiconductor lithography processes have been introduced. During the EUV semiconductor lithography processes, an electrostatic chuck (also known as an R-chuck, an E-chuck, or an ESC) is configured to hold a reflection-type mask through electrostatic forces, such that the EUV semiconductor lithography processes may optically transfer patterns of the reflection-type mask onto a wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic diagram illustrating a front view of an electrostatic chuck cleaning tool in accordance with some embodiments of the present disclosure.

DETAILED DESCRIPTION

Figure 2A:
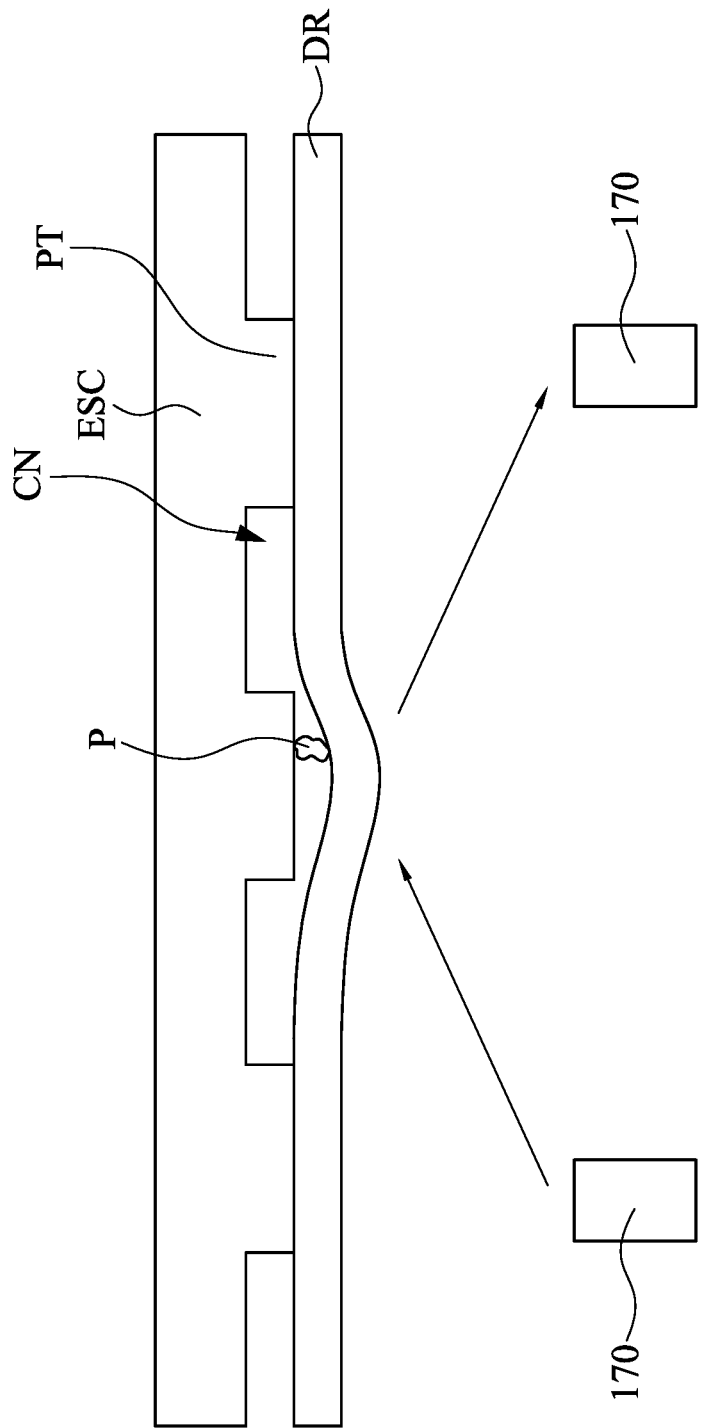
FIGS. 2A and 3A are schematic diagrams illustrating an optical inspection instrument of the electrostatic chuck cleaning tool in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around," "about," "substantially" or "approximately" shall generally mean within 20 percent, within 10 percent, or within 5 percent of a given value or range. Numerical quantities given herein are approximate, meaning that the term "around," "about," "substantially" or "approximately" can be inferred if not expressly stated.

An EUV semiconductor lithography process may utilize a plurality of mirrors and a reflection-type photomask (or referred to as a mask or a reticle) to form a pattern from the reflection-type mask onto a target wafer. In detail, a backside of the reflection-type photomask is releasably attached onto an electrostatic chuck through an electrostatic force. However, contamination (for example, tiny particle contamination) may occur on the electrostatic chuck, and more particularly, on a surface of the electrostatic chuck that contacts the backside of the reflection-type photomask. Hence, the aforementioned contamination may result in various issues, e.g., photomask deformation, so that the pattern on the reflection-type photomask may not be faithfully transferred onto the target wafer, resulting in deterioration in the performance of the wafer. Consequently, in an effort to adequately address these issues, an electrostatic chuck cleaning tool and an electrostatic chuck cleaning method are presented hereinafter in accordance with various embodiments of the present disclosure.

Reference is made to FIG. 1, which is a schematic diagram illustrating a front view of an electrostatic chuck cleaning tool 100 in accordance with some embodiments of the present disclosure. As shown in FIG. 1, the electrostatic chuck cleaning tool 100 includes a platform 110, a spindle 120, a motor 130, a casing 140, height sensors 150, and a vacuum source 160. The platform 110 has a sidewall 112 and a top surface 114. The spindle 120 is connected between the platform 110 and the motor 130. The casing 140 is disposed around and spaced apart from the sidewall 112 and the spindle 120, such that an exhaust duct 142 is defined therebetween. The height sensors 150 are located on the casing 140. The vacuum source 160 is connected to the exhaust duct 142. Therefore, the platform 110 may release a particle(s) P from the electrostatic chuck ESC through various methods that will be discussed below, and the vacuum source 160 may draw the particle P into the exhaust duct 142.

As shown in FIG. 1, protrusions PT on the electrostatic chuck ESC that contact a backside of a photomask may be referred to as mesas, bumps, pins, islands, surface structures, or the like. Further, multiple channels CN such as grooves and recesses may be formed between the protrusions PT for allowing fluid to flow therein. The channels CN may be fluidly coupled to a source of a thermally conductive fluid, such as helium (He) gas. Hence, the thermally conductive fluid may be provided at controlled pressure into the channels CN, so as to enhance the heat transfer between the electrostatic chuck ESC and the photomask. Additionally, when the photomask is held by the electrostatic chuck ESC, the protrusions PT may be in direct contact with the photomask. In the meantime, if particles P exist at the contact region between the electrostatic chuck ESC and the photomask, these particles P might lead to adverse impact, such as particle-induced distortion on the photomask.

As shown in FIG. 1, the platform 110, the spindle 120, and the motor 130 are connected in this sequence, i.e., these components are arranged from top to bottom. The motor 130 may rotate the platform 110 through the spindle 120. In some embodiments, the motor 130 may move the platform 110 toward the electrostatic chuck ESC and may refrain from rotating the platform 110 until the platform 110 is spaced apart from the electrostatic chuck ESC by a distance D1, in which the distance D1 may be in a range from about 100 um to about 10 nm. If the distance D1 is greater than about 100 um, the platform 110 may not interact with the particle P. If the distance is smaller than about 10 nm, collision between the platform 110 and the electrostatic chuck ESC may occur. In some embodiments, when the platform 110 starts to be rotated, the distance D1 is kept substantially constant and within the aforementioned range, such that the platform 110 may be spaced apart from the electrostatic chuck ESC by an appropriate distance that prevents the platform 110 from colliding with the electrostatic chuck ESC. Additionally, the sidewall 112 and/or the top surface 114 of the platform 110 may be in direct contact with the particle P without contacting the electrostatic chuck ESC, such that the particle P may be physically released from the electrostatic chuck ESC through the rotation of the platform 110.

As shown in FIG. 1, the motor 130 is located at the lowermost position compared with other components of the electrostatic chuck cleaning tool 100, such that these components may be arbitrarily moved along with the motor 130. More specifically, in addition to rotating the platform 110, the motor 130 may also move the platform 110 along a first direction 132 and a second direction 134 with respect to the electrostatic chuck ESC, in which the first direction 132 and the second direction 134 are perpendicular to each other. For example, the platform 110 may approach the electrostatic chuck ESC through decreasing the distance D1 along the first direction 132. As another example, when the platform 110 is rotated and spaced apart from the electrostatic chuck ESC by an appropriate distance, the platform 110 may be moved along the second direction 134 for cleaning more areas or different regions on the electrostatic chuck ESC. Additionally, the motor 130 may also move the platform 110 along a direction which is perpendicular to both the first direction 132 and the second direction 134. Hence, the motor 130 may operate to realize three-dimensional movement of the platform 110 with respect to the electrostatic chuck ESC, i.e., the platform 110 may be moved along a vertical direction and/or a horizontal direction with respect to the electrostatic chuck ESC.

As shown in FIG. 1, the casing 140 may enclose the sidewall 112 and the spindle 120 while the top surface 114 is exposed, such that a funnel-shaped casing may be provided to cover portions of the electrostatic chuck cleaning tool 100. In some embodiments, the contour of the casing 140 is substantially conformal to that of the sidewall 112 and the spindle 120. Hence, an exhaust duct 142 may be defined between the casing 140 and the covered portions of the electrostatic chuck cleaning tool 100. The exhaust duct 142 may draw the particle P released from the electrostatic chuck ESC. In some embodiments, the casing 140 may further enclose other components like the motor 130. In some embodiments, an uppermost portion of the casing 140 is substantially coplanar with the top surface 114 of the platform 110, such that accidental collision of the casing 140 with the electrostatic chuck ESC is prevented. In some embodiments, the uppermost portion of the casing 140 may be lower than the top surface 114 of the platform 110 for further preventing the accidental collision of the casing 140 with the electrostatic chuck ESC. In some embodiments, the sidewall 112 of the platform 110 may also contact the particle P to release the particle P from the electrostatic chuck ESC, such that a contact area of the platform 110 may be increased.

As shown in FIG. 1, the vacuum source 160 is in gaseous communication with the exhaust duct 142 for providing suction force through the exhaust duct 142. Hence, the particle P on the electrostatic chuck ESC may be drawn into the vacuum source 160 either directly or after the particle P is released from the electrostatic chuck ESC by the platform 110. On the other hand, the vacuum source 160 may also help filter out the particle P in the processing chamber where the electrostatic chuck ESC is positioned, such that the risk of particle contamination may be reduced. Further, the particle P may be trapped after being sucked into the vacuum source 160 for preventing the particle P from contaminating the electrostatic chuck ESC again.

As shown in FIG. 1, a pair of height sensors 150 is located on the casing 140, adjacent to the sidewall 112 of the platform 110, and communicated with the motor 130. The height sensors 150 can detect height of an object (i.e., dimension along the first direction 132). Hence, the height sensors 150 may detect the distance D1 between the top surface 114 of the platform 110 and the electrostatic chuck ESC. Further, when the distance D1 falls within an appropriate range as described above, a corresponding detection signal(s) may be sent by the height sensors 150 to the motor 130, such that the motor 130 maintains the distance D1 for enabling the platform 110 to release the particle P from the electrostatic chuck ESC and for preventing collision between the platform 110 and the electrostatic chuck ESC. In some embodiments, the height sensors 150 may have a sensing area 152 for detecting the distance D1 and the adjacent area of the electrostatic chuck ESC to check whether the particle P appears thereon. It is noted that the configuration of the height sensors 150 may be changed based on various designs, e.g., one of the height sensors 150 may be selectively omitted, more numbers of the height sensors 150 may be positioned around the casing 140, or the height sensors 150 may be positioned near the uppermost portion of the casing 140.

Reference is made to FIG. 2A, which is a schematic diagram illustrating an optical inspection instrument 170 of the electrostatic chuck cleaning tool 100 in accordance with some embodiments of the present disclosure. In some embodiments, the optical inspection instrument 170 is communicated with the motor 130 and configured to detect contamination, such as the particle P, on the protrusions PT of the electrostatic chuck ESC. Consequently, the optical inspection instrument 170 may determine whether a contamination like the particle P is present on the electrostatic chuck ESC and further detect a location of the particle P on the electrostatic chuck ESC.

As shown in FIG. 2A, the optical inspection instrument 170 is spaced apart from the electrostatic chuck ESC. When a dummy photomask DR is attached onto the electrostatic chuck ESC, the optical inspection instrument 170 may transmit radiation toward the dummy photomask DR and receive a reflection of the radiation from the dummy photomask DR. Subsequently, the optical inspection instrument 170 may analyze the transmitted and reflected radiation. In some embodiments, the optical inspection instrument 170 may check whether an intensity of the reflected radiation is within a predetermined range, such as about 95% to about 100% of the intensity of the transmitted radiation. When the particle P is present between the electrostatic chuck ESC and the dummy photomask DR, deformation of the dummy photomask DR may occur, such that the deformed area may not successfully reflect the transmitted radiation back to the optical inspection instrument 170. In other words, the transmitted radiation may be deflected to other places rather than back to the optical inspection instrument 170. Hence, the intensity of the reflected radiation from the deformed area may be significantly lowered. More specifically, when the intensity of the reflected radiation from an area on the dummy photomask DR is smaller than about 95%, it may be assumed that the area on the dummy photomask DR is a deformed area where the particle P is present.

Figure 2B:
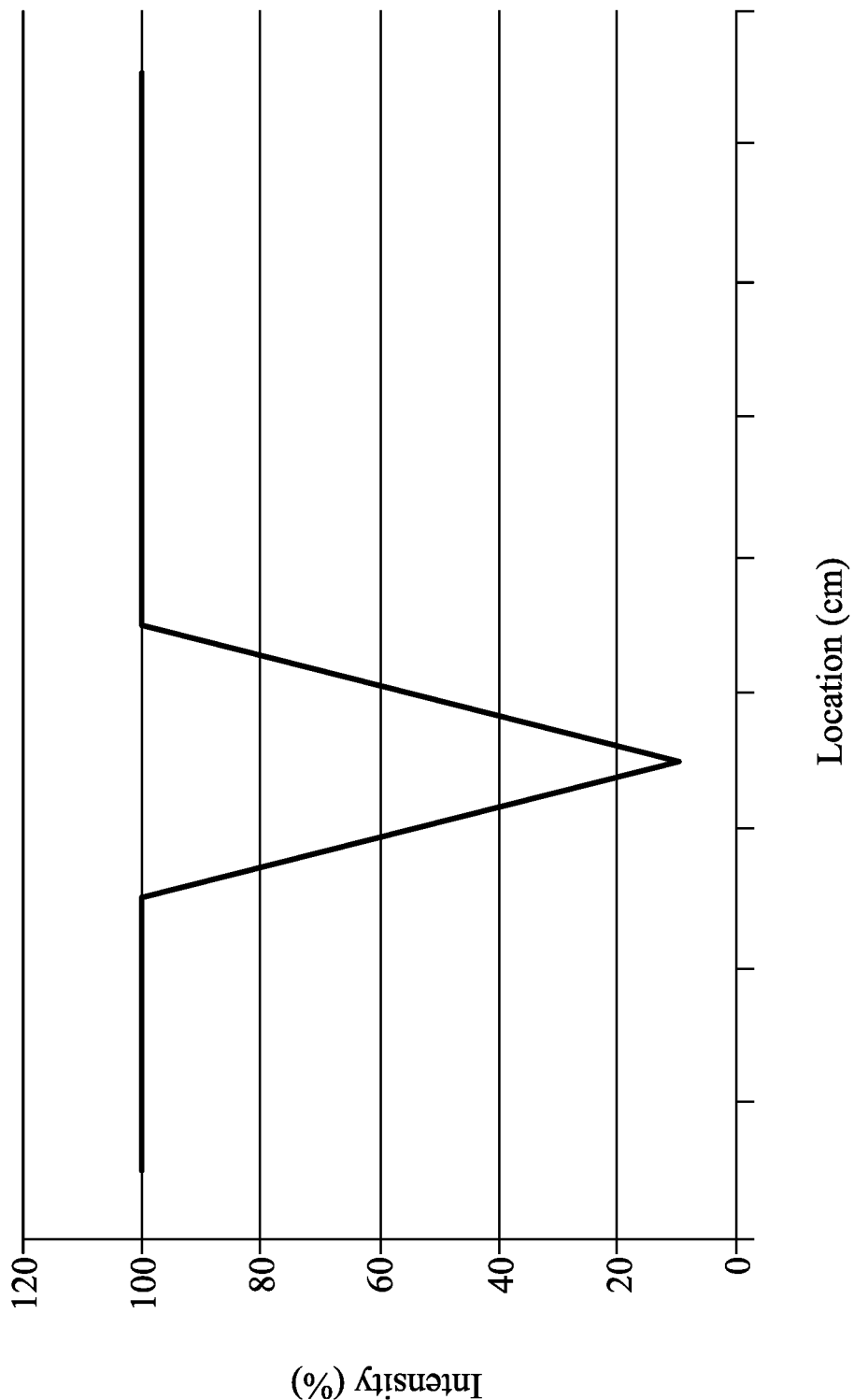
FIGS. 2B and 3B are line charts depicted according to FIGS. 2A and 3A, respectively.

Reference is made to FIG. 2B, which is a line chart depicted according to FIG. 2A. More specifically, the line chart of FIG. 2B and the schematic diagram of the optical inspection instrument 170 of FIG. 2A may collectively illustrate how the detection functions. Regarding the line chart, the vertical axis therein represents the intensity of the reflected radiation, and the horizontal axis therein represents the location on the dummy photomask DR. The optical inspection instrument 170 may transmit radiation to the dummy photomask DR and receive reflected radiation. Each location on the dummy photomask DR may have a corresponding intensity of the reflected radiation, such that a continuous line may be presented in the line chart for indicating the correlation between the location on the dummy photomask DR and the intensity of the reflected radiation. When no location on the dummy photomask DR is deformed, the intensity of the reflected radiation may be substantially the same as that of the transmitted radiation, e.g., the intensity of the reflected radiation may range between about 95% and about 100%. Conversely, when a particular location on the dummy photomask DR is deformed, the intensity of the reflected radiation may be decreased, e.g., the intensity of the reflected radiation may be smaller than about 95%. Hence, the location of the particle P may be obviously detected according to the line chart.

In some embodiments, the optical inspection instrument 170 may record the location of the particle P. Subsequently, through the communication between the optical inspection instrument 170 and the motor 130, the electrostatic chuck cleaning tool 100 may move toward the recorded location for improving the cleaning performance and efficiency.

Figure 3A:
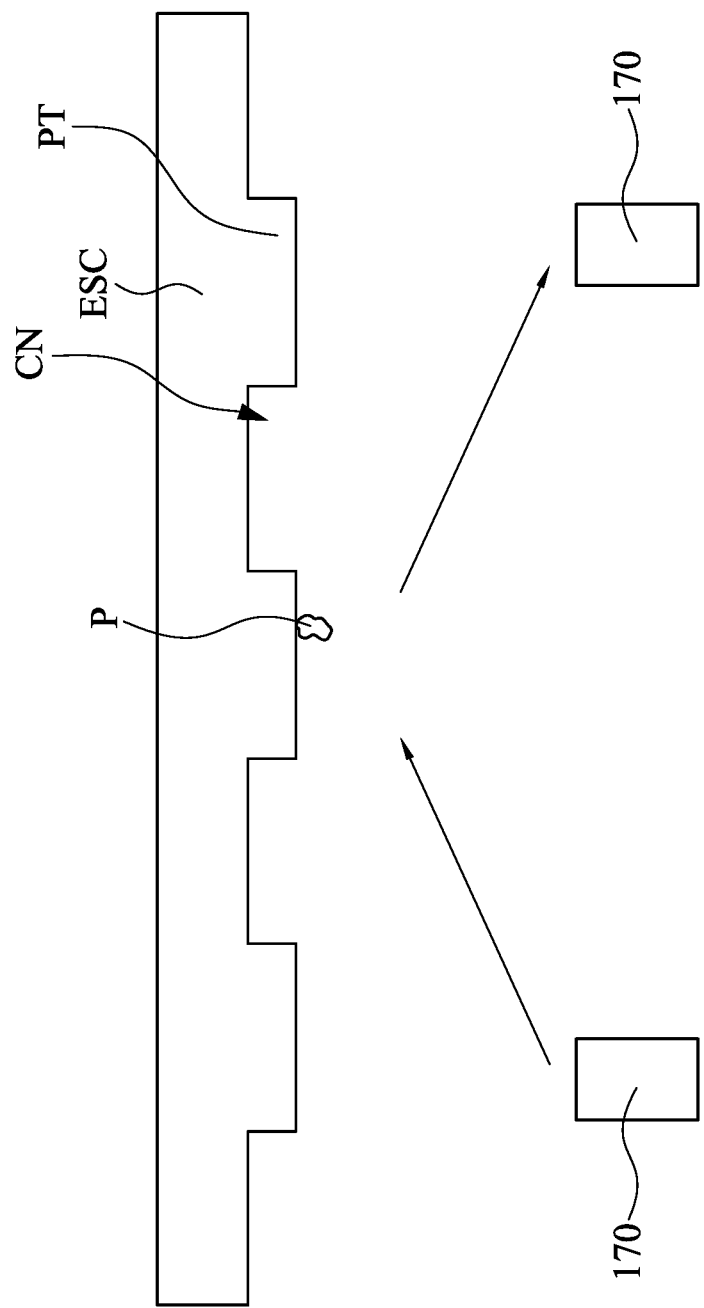

Reference is made to FIG. 3A, which is a schematic diagram illustrating another scenario of an operation of the optical inspection instrument 170 of the electrostatic chuck cleaning tool 100 in accordance with some other embodiments of the present disclosure. As shown in FIG. 3A, the optical inspection instrument 170 is spaced apart from the electrostatic chuck ESC, but the dummy photomask DR (as shown in FIG. 2A) is absent from between the optical inspection instrument 170 and the electrostatic chuck ESC. The optical inspection instrument 170 may transmit radiation directly onto the electrostatic chuck ESC and receive a reflection of the radiation from the electrostatic chuck ESC. Subsequently, the optical inspection instrument 170 may analyze the transmitted and reflected radiation. In some embodiments, the optical inspection instrument 170 may compare a detected intensity with a predetermined standard intensity with respect to the reflected radiation for checking if a difference therebetween at a location falls within a predetermined range, such as about 0% to about 5%. When the difference at a location is greater than about 5%, it may be assumed that the location on the protrusions PT of the electrostatic chuck ESC is contaminated by the particle P since the intensity of the reflected radiation may be decreased by the particle P.

Figure 3B:
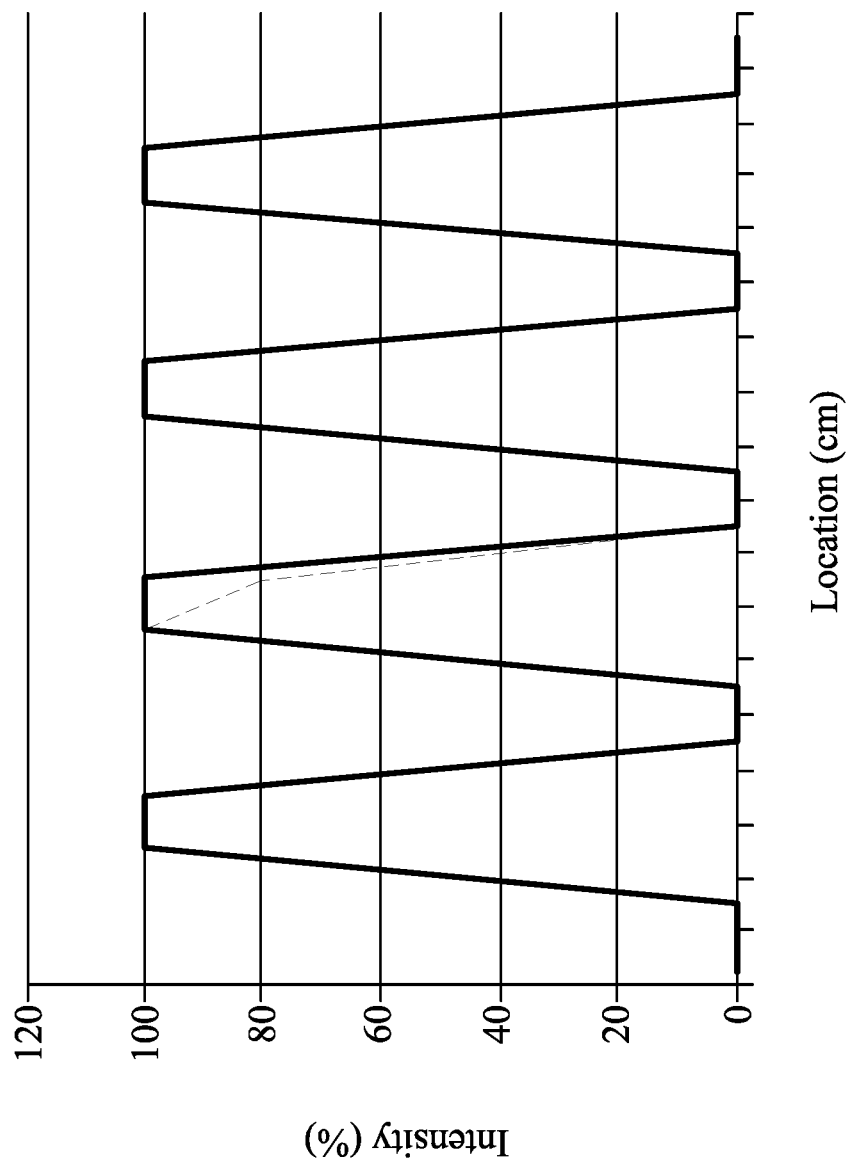

Reference is made to FIG. 3B, which is a line chart depicted according to FIG. 3A. More specifically, the line chart of FIG. 3B and the schematic diagram of the optical inspection instrument 170 of FIG. 3A may collectively illustrate how the detection functions. Regarding the line chart, the vertical axis therein represents the intensity of the reflected radiation and the horizontal axis therein represents the location on the electrostatic chuck ESC. Each location on the electrostatic chuck ESC may have a corresponding intensity of the reflected radiation, such that a continuous line may be presented in the line chart. The dotted line may represent the connection between the detected intensities of the reflected radiation. The solid line may represent the connection between the standard intensities of the reflected radiation. Since the particle P may deflect the transmitted radiation, the intensity of the reflected radiation from an area where the particle P is present may be substantially decreased. Hence, the location of the particle P may be adequately detected by comparing the detected intensity with the standard intensity. For example, when a difference between the detected and standard intensities at a location ranges between about 0% and about 5%, the location may be deemed normal. When a difference at a location is greater than about 5%, it may be assumed that the location is contaminated by the particle P.

Reference is made back to FIG. 1. The sidewall 112 and/or the top surface 114 of the platform 110 may directly contact the particle P without contacting the electrostatic chuck ESC. For example, the particle P may be physically released from the electrostatic chuck ESC and pushed outwardly toward the casing 140 through the rotation of the platform 110. Subsequently, the suction force provided by the vacuum source 160 may help collect the particle P into the vacuum source 160 through the exhaust duct 142. Hence, the particle P on the electrostatic chuck ESC may be fully removed. In some embodiments, the platform 110 may include a high friction material like an abrasive, such that the platform 110 may have a high friction surface to allow the particle P to be easily released from the electrostatic chuck ESC by the rotation of the platform 110.

Figure 4:
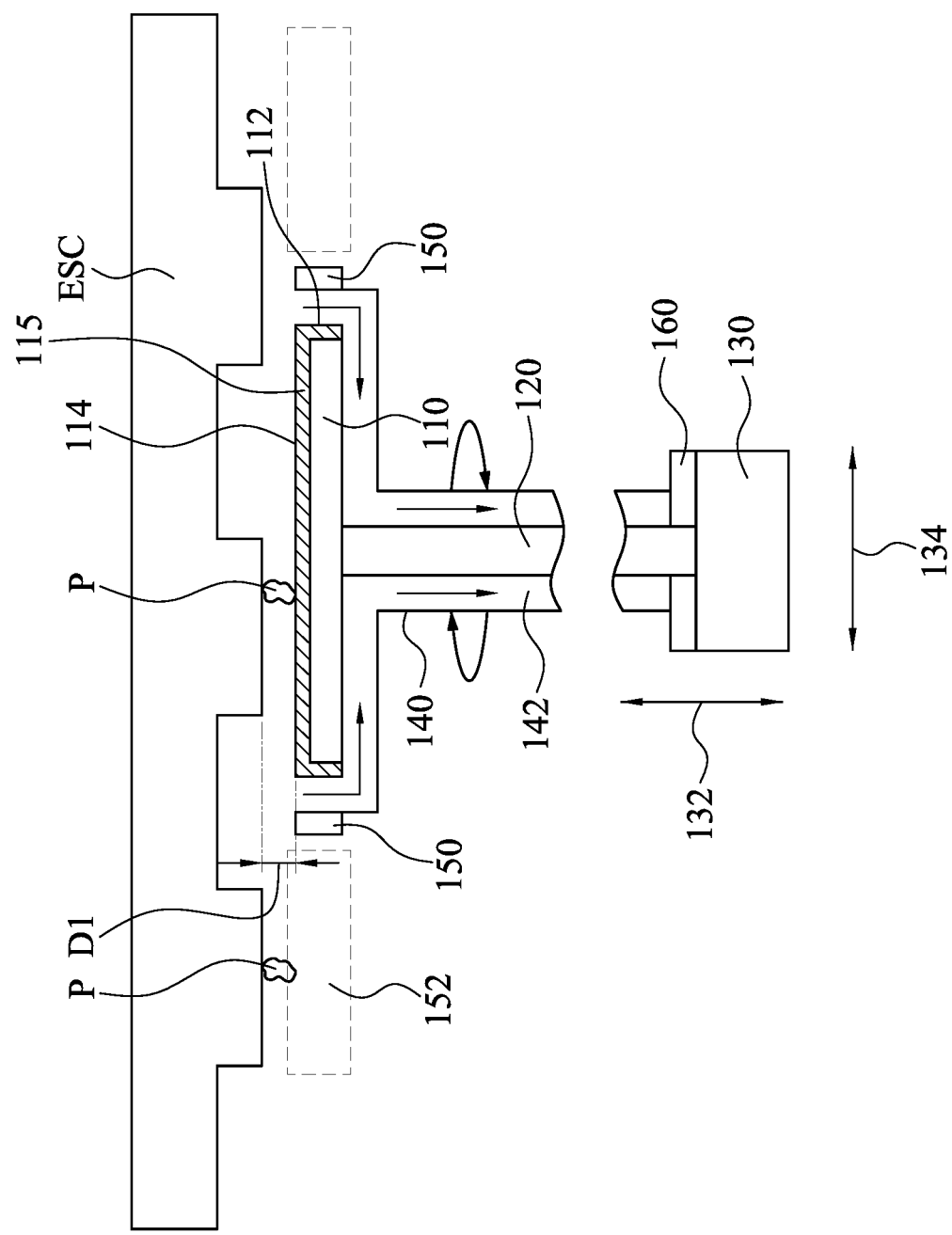
FIGS. 4-6 are schematic diagrams illustrating front views of an electrostatic chuck cleaning tool in accordance with some other embodiments of the present disclosure.

Reference is made to FIG. 4, which is a schematic diagram illustrating a front view of an electrostatic chuck cleaning tool 100a in accordance with some embodiments of the present disclosure. Since some components of FIG. 4 are similar to those corresponding components of FIG. 1, descriptions for those similar components will not be repeated hereinafter. As shown in FIG. 4, the platform 110 may include an adhesive material 115 thereon which is configured to adhere to the particle P on the electrostatic chuck ESC. In some embodiments, the adhesive material 115 is coated on the sidewall 112 and the top surface 114 of the platform 110. Due to the configuration of the adhesive material 115, after the adhesive material 115 is in direct contact with the particle P, the particle P may be subsequently taken away from the electrostatic chuck ESC through the rotation of the platform 110. It is noted that the configuration of the adhesive material 115 is not limited by the present embodiment, e.g., the platform 110 may be made of the adhesive material 115.

Figure 5:
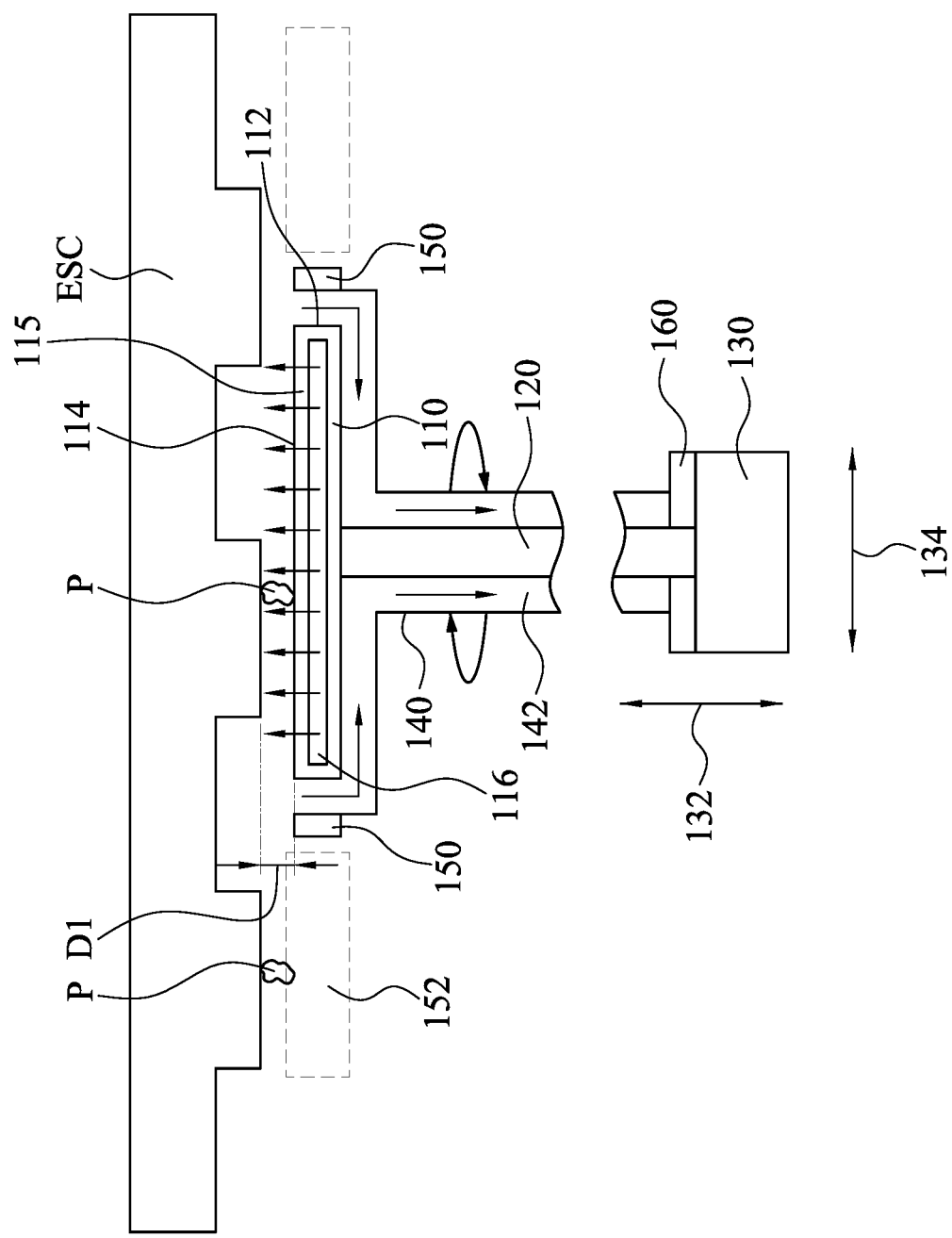

Reference is made to FIG. 5, which is a schematic diagram illustrating a front view of an electrostatic chuck cleaning tool 100b in accordance with some embodiments of the present disclosure. Since some components of FIG. 5 are similar to those corresponding components of FIG. 1, descriptions for those similar components will not be repeated hereinafter. As shown in FIG. 5, the platform 110 may include an ultrasound generator 116 therein which is configured to emit an ultrasound for separating the particle P from the electrostatic chuck ESC. Due to the configuration of the ultrasound generator 116, when the platform 110 is close to or in contact with the particle P, the ultrasound provided by the ultrasound generator 116 may induce oscillation of the particle P and thus decrease the adhesion between the particle P and the electrostatic chuck ESC. In this way, the particle P can be released from the electrostatic chuck ESC. Hence, the particle P may be removed from the electrostatic chuck ESC much easier. That is, the particle P may directly fall down due to the ultrasound vibration or may be easier to be physically released by the rotation of the platform 110.

Figure 6:
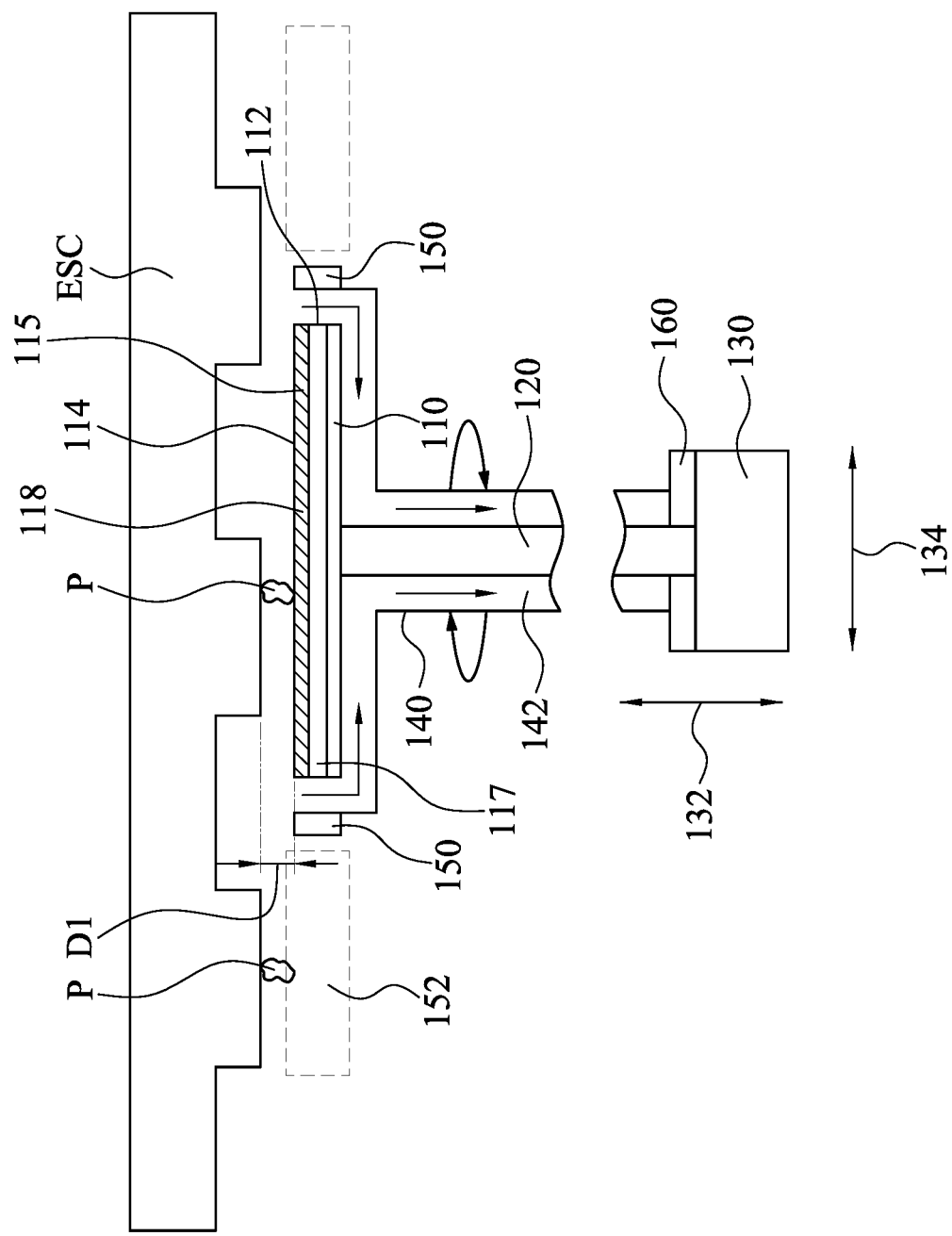

Reference is made to FIG. 6, which is a schematic diagram illustrating a front view of an electrostatic chuck cleaning tool 100c in accordance with some embodiments of the present disclosure. Since some components of FIG. 6 are similar to those corresponding components of FIG. 1, descriptions for those similar components will not be repeated hereinafter. As shown in FIG. 6, the platform 110 may include a light source 117 and a photo-catalyst material 118. In some embodiments, the light source 117 is positioned in the platform 110 and the photo-catalyst material 118 is located on the light source 117, such that the photo-catalyst material 118 may be agitated through irradiation of the light source 117 for photo-degrading the particle P. In some embodiments, the type of the light source 117 may be selected to cope with a particular type of particle contaminations. For example, a light source with a 254 nm wavelength may be used to photo-degrade contamination like $TiO_2$, or a light source with a 365 nm wavelength may be used to photo-degrade contamination like $SnO_2$. It is noted that the type of the light source 117 and the type of the photo-catalyst material 118 may be selected to collectively cope with different types of contamination based on various designs.

It is noted that the adhesive material 115, the ultrasound generator 116, and the light source 117 together with the photo-catalyst material 118 may be selectively applied to the platform 110 based on various designs. In some embodiments, the adhesive material 115 and the ultrasound generator 116 may be together applied to the platform 110, such that after the adhesion between the particle P and the electrostatic chuck ESC is substantially decreased by the ultrasound vibration, it is easier to move the particle P in contact with the adhesive material 115. In some embodiments, when at least one of the adhesive material 115, the ultrasound generator 116, and the light source 117 together with the photo-catalyst material 118 is individually or collectively utilized, the platform 110 may be rotated by the motor 130 at the same time, such that the particle removing performance may be further enhanced.

Figure 7C:
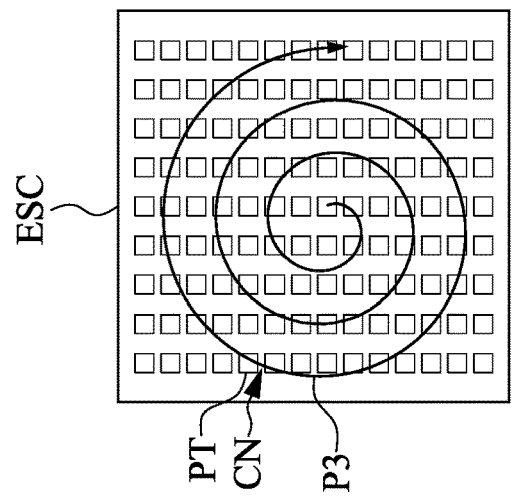
FIGS. 7A-7C are schematic diagrams illustrating various cleaning paths of the electrostatic chuck cleaning tool in accordance with some embodiments of the present disclosure.
Figure 7B:
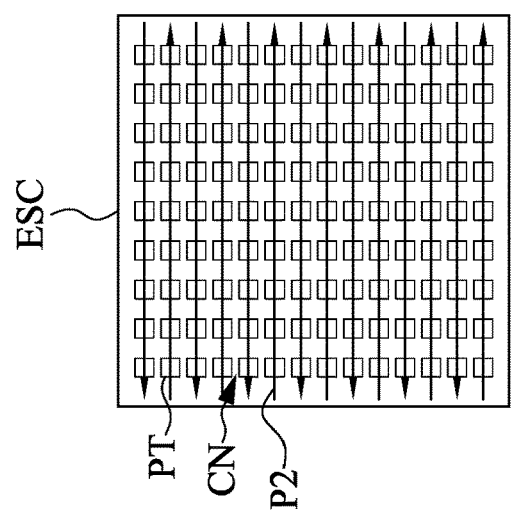
Figure 7A:
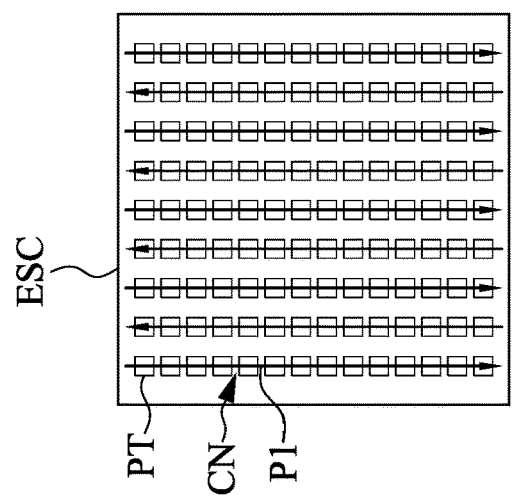

Reference is made to FIGS. 7A-7C, which are schematic diagrams illustrating various cleaning paths of the electrostatic chuck cleaning tool 100 in accordance with some embodiments of the present disclosure. A surface of the electrostatic chuck ESC may have a plurality of protrusions PT thereon and a plurality of channels CN between the protrusions PT. Additionally, the protrusions PT of the electrostatic chuck ESC may be in direct contact with a backside of a photomask so as to hold the photomask.

In some embodiments, as shown in FIG. 7A, the cleaning path P1 viewed from the bottom direction toward the electrostatic chuck ESC substantially resembles a straight-line course extending vertically. In detail, the cleaning path P1 passes through the protrusions PT of the electrostatic chuck ESC, such that the electrostatic chuck cleaning tool 100 may move along a plurality of vertical straight lines that are spaced apart from each other. Further, the moving directions of every two adjacent vertical straight lines are opposite to each other. For example, the protrusions PT of the electrostatic chuck ESC are arranged in rows and columns, the cleaning path P1 in FIG. 7A indicates that the electrostatic chuck cleaning tool 100 passes through a first column of the protrusions PT in one direction (e.g., downward direction shown in FIG. 7A) and then passes through a second column of the protrusions PT in an opposite direction (e.g., upward direction shown in FIG. 7A), and then repeats similar movements past other columns of the protrusions PT.

In some embodiments, as shown in FIG. 7B, the cleaning path P2 viewed from the bottom direction toward the electrostatic chuck ESC substantially resembles a straight-line course extending horizontally. In detail, the cleaning path P2 passes through the protrusions PT of the electrostatic chuck ESC, such that the electrostatic chuck cleaning tool 100 may move along a plurality of horizontal straight lines that are spaced apart from each other. Further, the moving directions of every two adjacent horizontal straight lines are opposite to each other. For example, the cleaning path P2 in FIG. 7B indicates that the electrostatic chuck cleaning tool 100 passes through a first row of the protrusions PT in one direction (e.g., leftward direction shown in FIG. 7B) and then passes through a second row of the protrusions PT in an opposite direction (e.g., rightward direction shown in FIG. 7B), and then repeats similar movements past other rows of the protrusions PT.

In some embodiments, as shown in FIG. 7C, the cleaning path P3 viewed from the bottom direction toward the electrostatic chuck ESC substantially resembles a spiral-line course. In detail, the spiral cleaning path P3 may pass through the protrusions PT of the electrostatic chuck ESC, such that the electrostatic chuck cleaning tool 100 may move along a spiral line. Further, the moving direction of the spiral line may start from substantially the center of the electrostatic chuck ESC and then spirally spread out.

Due to the arrangement of the cleaning path, the electrostatic chuck cleaning tool 100 may clean substantially all protrusions PT of electrostatic chuck ESC that may be in contact with the photomask. It is noted that the cleaning path is not limited by the aforementioned embodiments. For example, the cleaning path may be combinations of the aforementioned paths for adapting to various position arrangements of the protrusions PT of the electrostatic chuck ESC.

Each of the methods presented below is merely an example, and not intended to limit the present disclosure beyond what is explicitly recited in the claims. Additional operations can be provided before, during, and after each of the methods, and some operations described can be replaced, eliminated, or moved around for additional embodiments of the processes. For clarity and ease of explanation, some elements of the figures have been simplified.

Figure 8:
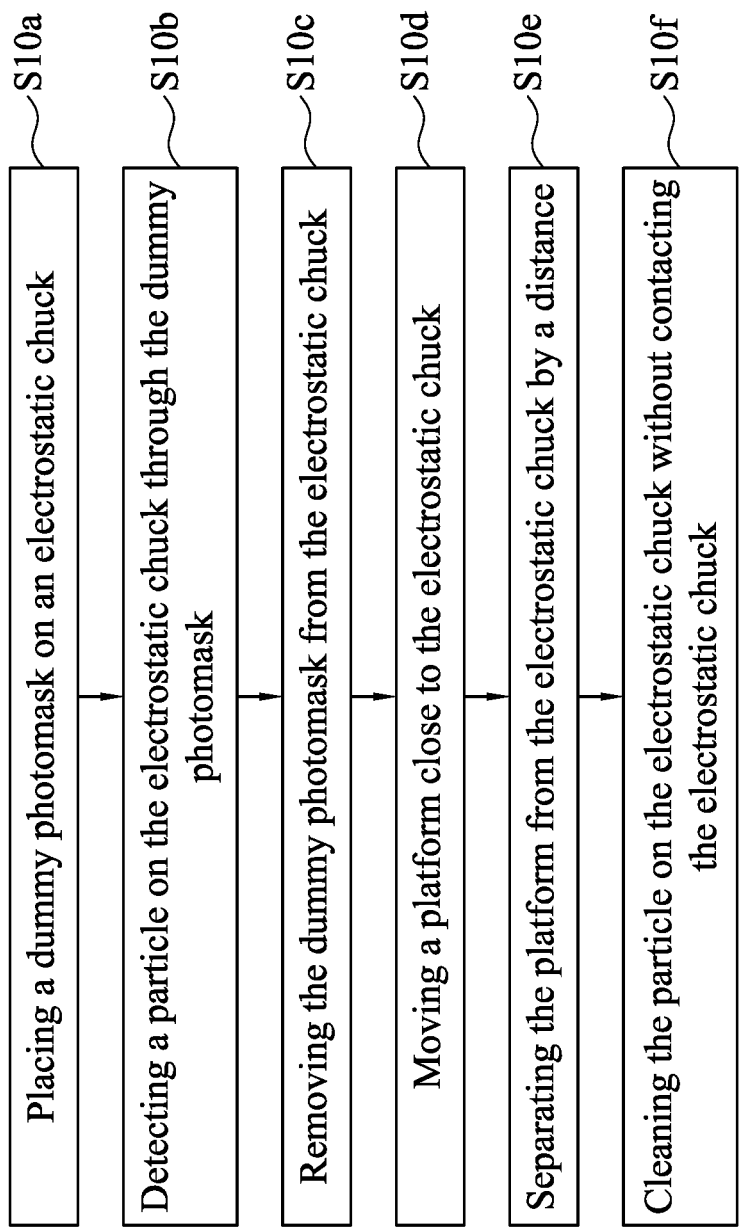
FIG. 8 is a flow chart illustrating a method for cleaning particle on an electrostatic chuck in accordance with some embodiments of the present disclosure.

Reference is made to FIG. 8, which is a flow chart illustrating a method for cleaning particle on an electrostatic chuck in accordance with some embodiments of the present disclosure. For illustration purposes, the electrostatic chuck cleaning tool 100 shown in FIG. 1 is referenced to collectively describe the details of the method.

The operation S10a includes placing a dummy photomask DR on an electrostatic chuck ESC. More specifically, as shown in FIG. 2A, when the dummy photomask DR is attached onto the electrostatic chuck ESC with a contamination like the particle P being present thereon, the dummy photomask DR may be deformed by the particle P between the dummy photomask DR and the electrostatic chuck ESC, such that a deformed area may be formed by the particle P.

The operation S10b is performed for detecting a particle P on the electrostatic chuck ESC through the dummy photomask DR. More specifically, the detection may be conducted through a variety of means, such as the analysis of radiation intensity, to identify the particle location. More detailed descriptions of the detection are presented below.

Figure 9:
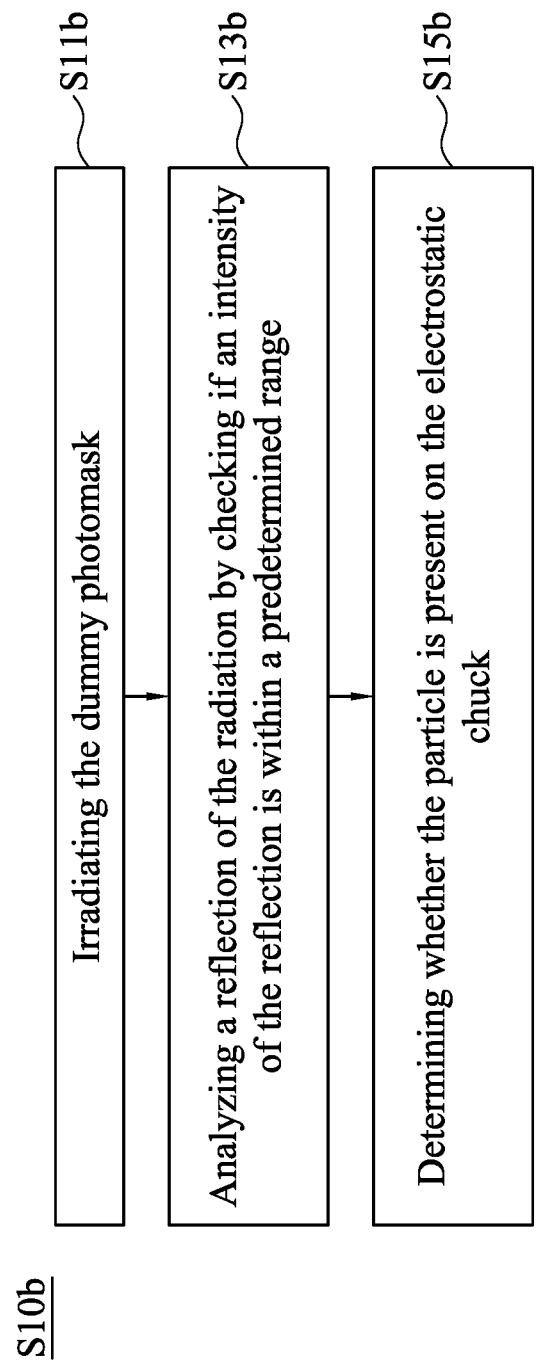
FIG. 9 is a flow chart of the operation S10b in FIG. 8 in accordance with some embodiments of the present disclosure.

Reference is made to the FIG. 9, which is a flow chart of the operation S10b of FIG. 8 in accordance with some embodiments of the present disclosure. The operation S10b may substantially include multiple operations S11b to S15b therein.

The operation S11b is performed for irradiating the dummy photomask DR. More specifically, as shown in FIG. 2A, the optical inspection instrument 170 may transmit a radiation to the dummy photomask DR and then receive the reflected radiation from the dummy photomask DR through different components of the optical inspection instrument 170. After the radiation is transmitted and received a plurality of times, full detection of the dummy photomask DR is possible. In some embodiments, the radiation may be transmitted and received through the same component of the optical inspection instrument 170.

On the other hand, in some embodiments, the optical inspection instrument 170 may be stationary during detection while the electrostatic chuck ESC may be movable during detection, such that the entire dummy photomask DR on the electrostatic chuck ESC can be detected through the movement of the electrostatic chuck ESC. In some embodiments, the electrostatic chuck ESC may be stationary during detection and the optical inspection instrument 170 may be movable during detection to detect the entire dummy photomask DR. Hence, the optical inspection instrument 170 and the electrostatic chuck ESC may be moved relative to each other during detection. In some embodiments, the detection path is substantially a straight-line course (e.g., similar to the straight-line course of the cleaning path as shown in FIG. 7A or 7B), a spiral-line course (e.g., similar to the spiral-line course of the cleaning path as shown in FIG. 7C), or combinations thereof, which may be substantially the same as the cleaning paths described above.

The operation S13b includes analyzing a reflection of the radiation. In some embodiments, the optical inspection instrument 170 may check whether an intensity of the reflected radiation is within a predetermined range, such as about 95% to about 100% of the intensity of the transmitted radiation. As shown in FIG. 2B, regarding the line chart, the vertical axis therein may represent the intensity of the reflected radiation and the horizontal axis therein may represent the location on the dummy photomask DR. As described above, the particle P present between the electrostatic chuck ESC and the dummy photomask DR may lower the intensity of the reflected radiation. Therefore, when the intensity of the reflected radiation from an area on the dummy photomask DR is smaller than about 95%, it may be assumed that this area on the dummy photomask DR is a deformed area where the particle P is present.

The operation S15b includes determining whether the particle P is present on the electrostatic chuck ESC based on the analyzation of the reflection of the radiation. More specifically, based on the analyzation result from the operation S13b as discussed above, the existence of the particle P may be identified through checking if the intensity of the reflection is within the predetermined range. Additionally, based on where the radiation is reflected, a location of the particle P may be detected and further recorded, so as to facilitate the following operations.

Reference is now made back to FIG. 8. The operation S10c includes removing the dummy photomask DR from the electrostatic chuck ESC. More specifically, after the operation S13b of identifying the location of the particle P, the dummy photomask DR may be removed from the electrostatic chuck ESC, such that subsequent cleaning processes of the electrostatic chuck ESC may be conveniently performed.

The operation S10d includes moving a platform 110 close to the electrostatic chuck ESC. More specifically, the operation S10d is performed when the determination from the operation S15b above determines that the particle P is present on the electrostatic chuck ESC. In some embodiments, the electrostatic chuck cleaning tool 100 may be movable and the electrostatic chuck ESC is stationary during movement of the electrostatic chuck cleaning tool 100, such that the platform 110 may be moved close to the particle P on the electrostatic chuck ESC to allow for interactions to take place between the platform 110 and the electrostatic chuck ESC. In some embodiments, the electrostatic chuck ESC is movable and the electrostatic chuck cleaning tool 100 is stationary during movement of the electrostatic chuck ESC for moving the electrostatic chuck ESC close to the platform 110. Hence, the electrostatic chuck cleaning tool 100 and the electrostatic chuck ESC may be moved relative to each other.

The operation S10e includes separating the platform 110 from the electrostatic chuck ESC by a distance D1. In some embodiments, the motor 130 may move the platform 110 toward the electrostatic chuck ESC and may refrain from rotating the platform 110 until a distance D1 between the platform 110 and the electrostatic chuck ESC falls within an appropriate range, e.g., the distance D1 may be in a range between about 100 um and about 10 nm. If the distance D1 is smaller than about 10 nm, a collision between the platform 110 and the electrostatic chuck ESC may occur. Conversely, if the distance D1 is greater than about 100 um, the platform 110 may not interact with the particle P. Additionally, as soon as rotation of the platform 110 is started, the distance D1 may be kept substantially the same, such that the collision between the platform 110 and the electrostatic chuck ESC may be prevented and the platform 110 may contact the particle P.

The operation S10*f* includes cleaning the particle P on the electrostatic chuck ESC without contacting the electrostatic chuck ESC. More specifically, the interactions between the platform 110 and the electrostatic chuck ESC for releasing the particle P may include various means as described below.

In some embodiments, the operation S10*f* may include rotating the platform 110 to release the particle P from the electrostatic chuck ESC. As shown in FIG. 1, the sidewall 112 and/or the top surface 114 of the platform 110 may directly contact the particle P without touching the electrostatic chuck ESC. Hence, the particle P may be physically released from the electrostatic chuck ESC and pushed outwardly toward the casing 140 through the rotation of the platform 110.

In some embodiments, the operation S10*f* may include adhering to the particle P through an adhesive material 115 on the platform 110 to release the particle P from the electrostatic chuck ESC. As shown in FIG. 4, the adhesive material 115 may adhere to the particle P on the electrostatic chuck ESC. After the adhesive material 115 is in direct contact with the particle P, the particle P may be subsequently released from the electrostatic chuck ESC due to movement of the platform 110, such as the linear movement and/or the rotation thereof.

In some embodiments, the operation S10*f* may include vibrating the particle P through an ultrasound emitted from the platform 110 to release the particle P from the electrostatic chuck ESC. As shown in FIG. 5, the ultrasound generator 116 may emit ultrasound toward the particle P on the electrostatic chuck ESC. Subsequently, when the platform 110 is close to or in contact with the particle P, the ultrasound may decrease the adhesion between the particle P and the electrostatic chuck ESC and thus release the particle P from the electrostatic chuck ESC. Hence, the particle P may be removed from the electrostatic chuck ESC much easier. In other words, the particle P may directly fall down due to the ultrasound vibration or may be easier to be physically released by the rotation of the platform 110.

In some embodiments, with reference to FIG. 6, the operation S10*f* may include photo-degrading the particle P through the photo-catalyst material 118 on the platform 110 to release the particle P from the electrostatic chuck ESC. The photo-catalyst material 118 may be agitated through irradiation of the light source 117. After the photo-catalyst material 118 is stimulated by the light source 117, the photo-catalyst material 118 may be moved to contact the particle P and then photo-degrade the particle P. In some embodiments, the type of the light source 117 may be selected to cope with a particular type of particle contaminations as described above.

In some embodiments, the operation S10*f* may include vacuuming the electrostatic chuck ESC. More specifically, the vacuum source 160 may provide suction force for drawing the particle P into the vacuum source 160 through the exhaust duct 142. In some embodiments, the vacuum source 160 may directly draw the particle P into the vacuum source 160. In some embodiments, the vacuum source 160 may function together with the various means for cleaning the particle P as described above for enhancing the cleaning performance. Since the vacuum source 160 may trap the released particle P, the particle P is prevented from contaminating the electrostatic chuck ESC again. In some embodiments, the suction force is provided by the vacuum source 160 to between the electrostatic chuck ESC and the platform 110 after the particle P is released from the electrostatic chuck ESC by the above-mentioned various means, such that the particle P may be removed from the electrostatic chuck ESC and then collected in the vacuum source 160. In some embodiments, the suction force is provided when the electrostatic chuck cleaning tool 100 functions, such that potential damage on the electrostatic chuck ESC caused by the particle P from the electrostatic chuck cleaning tool 100 may be decreased.

Furthermore, in some embodiments, the operation S10*f* may be performed along a cleaning path that is substantially a straight-line course, a spiral-line course, or combinations thereof as illustrated in FIGS. 7A to 7C. Hence, substantially every protrusion PT on the electrostatic chuck ESC that may contact the photomask can be cleaned. In some embodiments, the detected path in the operation S11*b* may be substantially the same as the cleaning path, such that the electrostatic chuck cleaning tool 100 may conduct a more precise cleaning operation toward the area where the particle P is detected.

Figure 10:
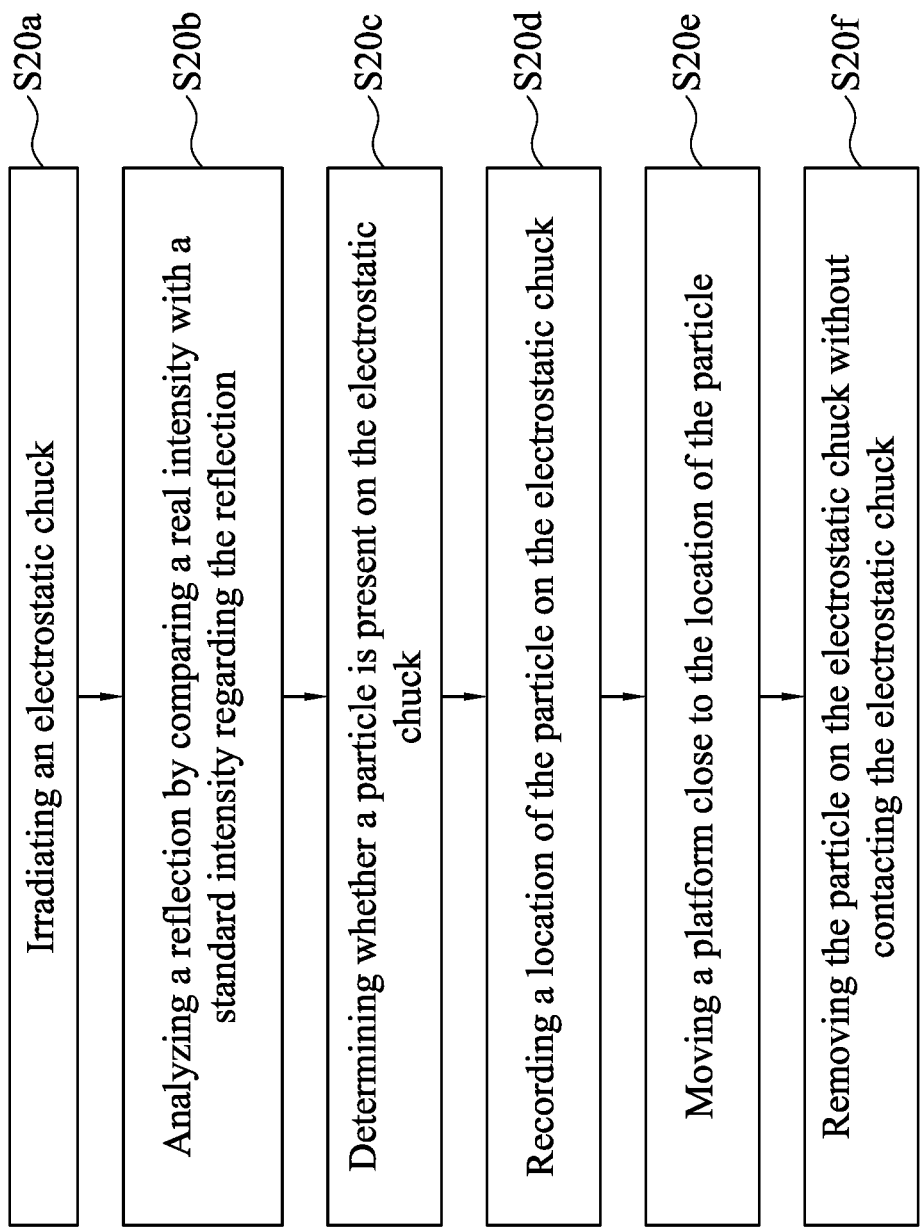
FIG. 10 is a flow chart illustrating a method for cleaning particle on an electrostatic chuck in accordance with some other embodiments of the present disclosure.

Reference is made to FIG. 10, which is a flow chart illustrating a method for cleaning particle on an electrostatic chuck in accordance with some other embodiments of the present disclosure. For illustration purposes, the electrostatic chuck cleaning tool 100 is referenced to collectively describe the details of the method as presented below.

The operation S20*a* includes irradiating an electrostatic chuck ESC. More specifically, as shown in FIG. 3A, the optical inspection instrument 170 may transmit a radiation directly to the electrostatic chuck ESC and receive the reflected radiation from the electrostatic chuck ESC for scanning the electrostatic chuck ESC. Similarly, the electrostatic chuck ESC and the optical inspection instrument 170 may be moved relative to each other to allow for irradiating the entire electrostatic chuck ESC.

The operation S20*b* includes analyzing a reflection of the radiation. More specifically, as shown in FIG. 3B, the optical inspection instrument 170 may compare a detected intensity (represented by the dotted line) with a standard intensity (represented by the solid line) with respect to the reflected radiation. Subsequently, the optical inspection instrument 170 may check whether a difference between the detected intensity and the standard intensity at a location falls within a predetermined range, such as about 0% to about 5%. When the difference at a location is greater than about 5%, it may be assumed that the location on the electrostatic chuck ESC is contaminated by the particle P since the intensity of the reflected radiation may be decreased by the particle P.

The operation S20*c* includes determining whether the particle P is present on the electrostatic chuck ESC based on the reflection of the radiation transmitted by the optical inspection instrument 170. More specifically, based on the analyzation result from the operation S20*b* as discussed above, the existence of the particle P may be determined through comparing the real intensity with the standard intensity with respect to each reflected radiation.

The operation S20*d* includes recording a location of the particle P on the electrostatic chuck ESC when the determination from the operation S20c as discussed above determines that the particle P is present on the electrostatic chuck ESC. In some embodiments, after the electrostatic chuck ESC is irradiated and the location of the particle P is identified, the optical inspection instrument 170 may record the location, such that the electrostatic chuck cleaning tool 100 may enhance the cleaning to the location as described below.

The operation S20e includes moving a platform 110 close to the location of the particle P. In some embodiments, through the communication between the optical inspection instrument 170 and the motor 130, the motor 130 may move the platform 110 toward the recorded location of the particle P. In some embodiments, when multiple locations are recorded, the platform 110 may approach the recorded locations one by one. In some embodiments, the platform 110 may move along the cleaning path and/or the detected path as mentioned above and then temporarily stay at the recorded location for enhancing the cleaning thereto.

The operation S20f includes removing the particle P on the electrostatic chuck ESC without contacting the electrostatic chuck ESC. Since some actions of the operation S20f are similar to the corresponding actions of the operation S10f described above, descriptions for the similar actions will not be repeated hereinafter.

Based on the above-mentioned descriptions, various advantages may be provided by the present disclosure. In detail, the particle on the electrostatic chuck may be fully detected by irradiating a surface of the electrostatic chuck with or without a dummy photomask. A variety of means for releasing the particle on the electrostatic chuck may include contacting the particle with a rotated platform, adhering to the particle, vibrating the particle, photo-degrading the particle, or combinations thereof. Additionally, when at least one of the various means is conducted, a vacuum source may provide suction force to individually or collectively draw the particle into the vacuum source. Therefore, the in-situ detecting and cleaning with respect to the particle may be achieved, such that the presence of particles on the electrostatic chuck may be minimized. Additionally, since the particle contamination is reduced, the machine operating time may be increased, while the costs associated with photomask damage and product reworking may be decreased.

In some embodiments, a method includes transmitting a radiation toward an electrostatic chuck, receiving a reflection of the radiation, analyzing the reflection of the radiation, determining whether a particle is present on the electrostatic chuck based on the analyzing the reflection of the radiation, and moving a cleaning tool to a location of the particle on the electrostatic chuck when the determination determines that the particle is present.

In some embodiments, a method includes moving a platform of a cleaning tool toward an electrostatic chuck, releasing a particle from the electrostatic chuck using the platform of the cleaning tool, and drawing the particle from above the platform into an exhaust duct around the platform using a vacuum source in gaseous communication with the exhaust duct after releasing the particle from the electrostatic chuck.

In some embodiments, a cleaning tool includes a rotatable platform, a motor, a casing, and a vacuum source. The rotatable platform has a sidewall and a top surface. The motor is configured to actuate a three-dimensional movement of the rotatable platform. The casing is around the rotatable platform and free from covering the top surface of the rotatable platform. The casing and the sidewall of the rotatable platform defines an exhaust duct around the rotatable platform. The vacuum source is connected to the exhaust duct.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cleaning tool, comprising:
a platform;
a motor configured to move the platform toward a bottom of an electrostatic chuck;
a casing surrounding the platform, wherein the casing and the platform define an exhaust duct therebetween;
a vacuum source connected to the exhaust duct;
a light source in the platform; and
a photo-catalyst material covering the light source.

2. The cleaning tool of claim 1, further comprising:
a spindle connected to a bottom surface of the platform, wherein the casing has a portion extending along while separated from the spindle.

3. The cleaning tool of claim 2, wherein said portion of the casing extending along while separated from the spindle and the spindle define a lower portion of the exhaust duct.

4. The cleaning tool of claim 1, wherein the casing has a stepped profile.

5. The cleaning tool of claim 1, further comprising:
a height sensor adjacent to a sidewall of the casing, wherein the exhaust duct has a portion between the height sensor and a sidewall of the platform.

6. The cleaning tool of claim 1, further comprising:
an optical inspection instrument in communication with the motor, wherein the motor is configured to move the platform in response to an inspection result of the optical inspection instrument.

7. A cleaning tool, comprising:
a platform;
a motor configured to rotate the platform below an electrostatic chuck;
a casing surrounding the platform, wherein the casing and the platform define an exhaust duct therebetween;
an adhesive material in contact with the platform at a first inner sidewall of the exhaust duct but spaced apart from the casing at a second inner sidewall of the exhaust duct; and
a height sensor adjacent to a sidewall of the casing and configured to detect a distance between a top surface of the platform and a bottom surface of the electrostatic chuck.

8. The cleaning tool of claim 7, wherein the height sensor is in communication with the motor.

9. The cleaning tool of claim 7, wherein the sidewall of the casing is between the height sensor and a sidewall of the platform.

10. The cleaning tool of claim 7, wherein the top surface of the platform is free from coverage by the casing.

11. The cleaning tool of claim 7, further comprising a spindle below the platform, wherein the casing comprises a first portion extending along while separated from a sidewall of the platform, a second portion extending along while separated from a bottom surface of the platform and a third portion extending along while separated from a sidewall of the spindle.

12. The cleaning tool of claim 11, wherein the height sensor is adjacent to a sidewall of the first portion of the casing.

13. A cleaning tool, comprising:
a platform;
a motor connected to the platform;
an optical inspection instrument below an electrostatic chuck and in communication with the motor, wherein the optical inspection instrument is configured to detect a location of a particle on the electrostatic chuck, and the motor is configured to move the platform toward the location of the particle;
a casing surrounding the platform, wherein the casing and the platform define an exhaust duct therebetween; and
an adhesive material in contact with the platform at a first inner sidewall of the exhaust duct but spaced apart from the casing at a second inner sidewall of the exhaust duct.

14. The cleaning tool of claim 13, wherein the optical inspection instrument is configured to transmit radiation toward a photomask that is below the electrostatic chuck and receive a reflection of the radiation from the photomask.

15. The cleaning tool of claim 13, wherein the optical inspection instrument is configured to transmit radiation toward the electrostatic chuck and receive a reflection of the radiation from the electrostatic chuck.

16. The cleaning tool of claim 1, wherein the light source is directly between the photo-catalyst material and a bottom surface of the platform.

17. The cleaning tool of claim 1, wherein the light source is spaced apart from the casing.

18. The cleaning tool of claim 1, wherein the light source is surrounded by the casing.

19. The cleaning tool of claim 7, wherein a bottom surface of the platform is free from coverage by the adhesive material.

20. The cleaning tool of claim 13, wherein the casing is spaced apart from the optical inspection instrument.

* * * * *